(12) United States Patent
Holec et al.

(10) Patent No.: US 7,980,863 B1
(45) Date of Patent: Jul. 19, 2011

(54) PRINTED CIRCUIT BOARD FLEXIBLE INTERCONNECT DESIGN

(75) Inventors: Henry V. Holec, Mendota Heights, MN (US); Wm. Todd Crandell, Minnetonka, MN (US)

(73) Assignee: Metrospec Technology, LLC, Mendota Heights, MN (US)

( * ) Notice: Subject to any disclaimer, the term of this patent is extended or adjusted under 35 U.S.C. 154(b) by 0 days.

(21) Appl. No.: 12/372,499

(22) Filed: Feb. 17, 2009

Related U.S. Application Data

(60) Provisional application No. 61/028,779, filed on Feb. 14, 2008, provisional application No. 61/037,595, filed on Mar. 18, 2008.

(51) Int. Cl.
*H01R 12/00* (2006.01)
(52) U.S. Cl. .......................................................... 439/67
(58) Field of Classification Search .................. 439/67, 439/65, 56, 57; 174/88 R; 362/806
See application file for complete search history.

(56) References Cited

U.S. PATENT DOCUMENTS

| | | | | |
|---|---|---|---|---|
| 2,731,609 A | * | 1/1956 | Sobel, III | 439/74 |
| 3,086,189 A | * | 4/1963 | Robbins | 439/634 |
| 3,270,251 A | * | 8/1966 | Evans | 361/729 |
| 3,401,369 A | * | 9/1968 | Roche et al. | 439/62 |
| 4,250,536 A | * | 2/1981 | Barringer et al. | 361/787 |
| 4,526,432 A | * | 7/1985 | Cronin et al. | 439/320 |
| 4,533,188 A | * | 8/1985 | Miniet | 439/77 |
| 4,618,194 A | * | 10/1986 | Kwilos | 439/64 |
| 4,991,290 A | * | 2/1991 | MacKay | 29/884 |
| 5,001,605 A | | 3/1991 | Savagian et al. | |
| 5,375,044 A | * | 12/1994 | Guritz | 362/104 |
| 5,404,044 A | * | 4/1995 | Booth et al. | 257/698 |
| 5,440,454 A | * | 8/1995 | Hashimoto et al. | 361/790 |
| 5,575,554 A | * | 11/1996 | Guritz | 362/103 |
| 6,113,248 A | | 9/2000 | Mistopoulos et al. | |
| 6,299,337 B1 | | 10/2001 | Bachl et al. | |
| 6,601,292 B2 | * | 8/2003 | Li et al. | 29/829 |
| 6,729,888 B2 | * | 5/2004 | Imaeda | 439/66 |
| 6,991,473 B1 | * | 1/2006 | Balcome et al. | 439/67 |
| 7,331,796 B2 | | 2/2008 | Hougham et al. | |
| 7,377,669 B2 | | 5/2008 | Farmer et al. | |
| 7,448,923 B2 | * | 11/2008 | Uka | 439/876 |
| 7,665,999 B2 | | 2/2010 | Hougham et al. | |
| 2003/0193789 A1 | | 10/2003 | Karlicek, Jr. | |

(Continued)

OTHER PUBLICATIONS

"Final Office Action mailed Jul. 12, 2010 in co-pending U.S. Appl. No. 12/406,761, "Printed Circuit Board Interconnect Construction," (6 pages)."

(Continued)

*Primary Examiner* — T C Patel
*Assistant Examiner* — Vladimir Imas
(74) *Attorney, Agent, or Firm* — Pauly, DeVries Smith & Deffner, L.L.C.

(57) ABSTRACT

In some embodiments, a circuit board interconnect may include one or more of the following features: (a) a first circuit board having a plated through hole within a metal pad on the circuit board, the through hole providing a passage for solder to connect the first circuit board to a second circuit board, (b) a second circuit board having a metal pad able to couple to the first circuit board in an overlapping fashion when solder is passed through the plated through hole, and (c) a non-conductive solder repelling material on a surface of one circuit board.

16 Claims, 15 Drawing Sheets

U.S. PATENT DOCUMENTS

| | | |
|---|---|---|
| 2003/0223210 A1 | 12/2003 | Chin |
| 2004/0087190 A1* | 5/2004 | Miyazawa et al. ............... 439/67 |
| 2008/0249363 A1* | 10/2008 | Nakamura et al. ............ 600/132 |
| 2008/0254653 A1* | 10/2008 | Uka ................................ 439/67 |
| 2008/0310141 A1* | 12/2008 | Mezouari ........................ 362/30 |
| 2008/0311771 A1 | 12/2008 | Cho |
| 2009/0029570 A1* | 1/2009 | Ikeuchi et al. .................. 439/67 |
| 2009/0226656 A1 | 9/2009 | Crandell et al. |

OTHER PUBLICATIONS

"Non-Final Office Action mailed Apr. 1, 2010 in co-pending U.S. Appl. No. 12/406,761, "Printed Circuit Board Interconnect Construction" (5 pages)."

U.S. Prosecution History of U.S. Appl. No. 12/406,761, Circuit Boards Interconnected By Overlapping Plated Through Holes Portions (214 pgs).

\* cited by examiner

PRINTED CIRCUIT BOARD FLEXIBLE INTERCONNECT DESIGN

CROSS-REFERENCE TO RELATED APPLICATIONS

The present application claims priority to U.S. Patent Application Ser. No. 61/028,779, filed on Feb. 14, 2008, titled Flexible Interconnect Design and Method for Printed Circuit Boards, listing Henry V. Holec and Wm. Todd Crandell as inventors, herein incorporated by reference in its entirety and to U.S. Patent Application Ser. No. 61/037,595, filed on Mar. 18, 2008, titled Front Side Features for Flexible Circuit Boards, listing Henry V. Holec and Wm. Todd Crandell as inventors, herein incorporated by reference in its entirety.

FIELD OF THE INVENTION

Embodiments of the present invention relate to the design and method of interconnecting printed circuit boards. Particularly, embodiments of the present invention disclose a method for making long or continuous circuit strips and using the same. More particularly, embodiments of the present invention disclose the construction of layered, semi-flexible circuit strips for use with high powered LEDs in Solid State Lighting (SSL) applications.

BACKGROUND OF THE INVENTION

In many electronic systems and products, multiple printed circuit boards are used with connectors, harnesses and cables making circuit connections between them. Interconnection of circuit boards may be accomplished by the use of surface mount connectors, wires or wire cables, flex circuit strips, edge connectors, wire pins or shunts. Typically, these connections carry power from one circuit to another, as well as conductors for electronic communication, sensing and control. While there are many types of connections, there are limitations and disadvantages to most of them.

In some applications it is desirable to connect one board to another over a short distance, with minimal numbers of components and material employed in the connection. Further, the type and number of interconnections has a strong effect on reliability. Conventional cables and harnesses employ wires, terminals and pins, which must be joined together mechanically. Failure in any one of these joints or reduction in conductivity due to mechanical effects, corrosion or fracture will cause failure of the circuit. For this reason, solder joints are often used because of their reliability and permanence.

Solder connection between circuit boards, while being reliable, usually require the spanning of the distance between boards or conductors with a conductor—such as a pin (a shunt being a larger form of pin) or a wire. Pins are rigid and sometimes present unwanted stresses on the board and connection locations (the pads and holes). Secondary mechanical structures are added to reduce and control stresses. The pins themselves must be soldered to the board either manually (one at a time) or using special equipment. Press-in pins (pins, which rely on mechanical interference with conductors or pads) are sometimes used when geometries are fixed and well controlled.

Wires are flexible but are more difficult to reliably solder join and lack the structure for mechanical linkage when this is required. Typically, wires are directly soldered onto boards and are inserted through holes or soldered onto an enlarged copper pad. Direct soldering of wires is often done manually or with the use of equipment specialized for this purpose. Additional mechanical structures, called strain relief, are required to prevent mechanical fatigue and fraying of the wire adjacent to the solder joint if any type of motion or vibration is anticipated.

A third type of interconnect, called a flex circuit, is particularly advantageous where multiple circuits are joined carrying small amounts of current in limited space. Flex circuits are typically made by printing a thin metal conductive layer with a conductive pattern on a highly flexible plastic substrate. To prevent damage to the thin conductive layer, an additional layer of plastic is laminated over the conductor to form a sandwich. Access to the conductors is provided via holes in one or both of the plastic layers. Still, in order to gain robustness at the connecting ends, mechanical connectors or soldered pins must be added to the design. Flex circuits usually do not add to the mechanical stability or strength of the board-to-board connection.

For almost all of these connection methods described above, protection of the connection from shorting contact, mechanical damage or ESD discharge requires an additional mechanical cover or coating to be added after the solder connection, adding more complexity and cost to the implementation. Also, most of these interconnection methods present difficulties because of their mechanical sizes, geometries and lack of precise and flat mating surfaces for use on strictly surface mount boards.

In various applications, such as production of high power solid state (LED) lighting strips it is advantageous to have interconnections between circuit boards which are highly reliable, carry significant levels of current or voltage without loss, are protected from mechanical damage and shorting, allow various shapes and geometries of connection and are easy and efficient to apply. Embodiments of the present invention described below describe interconnections providing specific advantages over both traditional and more recent methods of interconnect such as the newly introduced FlexRAD system of continuous connection. Embodiments of the present invention include aspects addressing the strength, reliability and usability of interconnects between the semi-flexible substrates in order to produce long strips or continuous reels for ease in fixture assembly.

Long lengths and or continuous runs of SSL circuit strips are desirable for the reasons stated above. In addition the format of these semi-flexible continuous circuits is beneficial to the manufacture of the continuous circuit or installation into the final SSL fixture. Embodiments of the present invention described below conceive numerous methods to reduce manufacturing, installation and assembly costs. These system cost reductions further enable the adoption of SSL in a variety of applications thus reducing global energy consumption.

Solid-state lighting (SSL) refers to a type of lighting that utilizes light-emitting diodes (LEDs), organic light-emitting diodes (OLED), or polymer light-emitting diodes (PLED) as sources of illumination rather than electrical filaments, plasma (used in arc lamps such as fluorescent lamps), or gas. The term "solid state" refers to the fact light in an LED is emitted from a solid object; a block of semiconductor rather than from a vacuum or gas tube, as is the case in traditional incandescent light bulbs and fluorescent lamps. Compared to incandescent lighting, however, SSL creates visible light with reduced heat generation or parasitic energy dissipation, similar to fluorescent lighting. In addition, its solid-state nature provides for greater resistance to shock, vibration and wear, thereby increasing its lifespan significantly. Solid-state lighting is often used in traffic lights and is also used frequently in modern vehicle lights, train marker lights etc.

BRIEF SUMMARY OF THE INVENTION

In some embodiments, an apparatus for connecting circuit boards may include one or more of the following features: (a) a connector board, (b) a metal pad having a plated through hole on the connector board, (c) circuit paths corresponding to the plated through hole to provide electrical connectivity between a first and second circuit board, (d) an electrically conductive layer, (e) an electrical isolating material adjacent to the electrically conductive material, and (f) a non-conductive solder repelling material on the connector board.

In some embodiments, a circuit board interconnect may include one or more of the following features: (a) a first circuit board having a plated through hole within a metal pad on the circuit board, the through hole providing a passage for solder to connect the first circuit board to a second circuit board, (b) a second circuit board having a metal pad able to couple to the first circuit board in an overlapping fashion when solder is passed through the plated through hole, and (c) a non-conductive solder repelling material on a surface of one circuit board.

In some embodiments, a method of coupling circuit boards together may include one or more of the following steps: (a) placing a connector board having a plated through hole on opposing sides of the connector board on opposing ends of a first and second circuit board, (b) heating solder to flow through the plated through hole, (c) allowing solder to flow and couple the connector board with the first and second circuit board, (d) fabricating circuit panels having a plurality of circuit strips, (e) placing LEDs onto the circuit panels, (f) separating joined strip assemblies from each other, (g) joining individual circuit strips into larger strip, and (h) exposing circuit joints for assembly.

DETAILED DESCRIPTION

Figure 1:
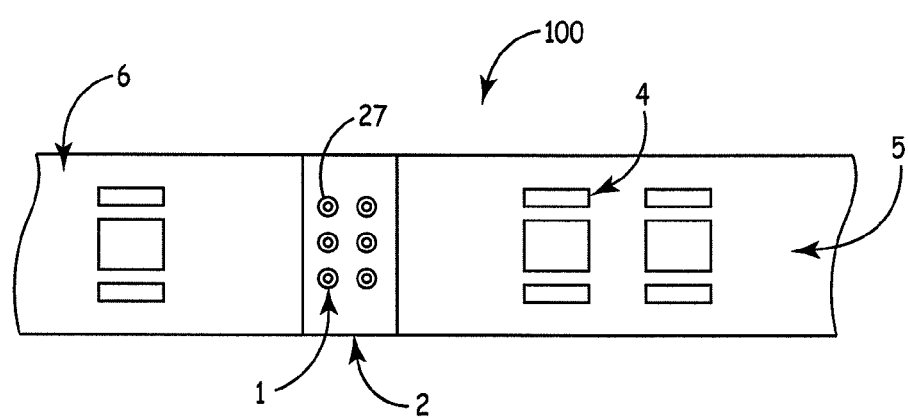
FIG. 1 shows a top view of two circuit boards connected with connector in an embodiment of the present invention.

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings.

The inventors of embodiments of the present invention have developed an alternative connector design and method of connection for rigid connectors, wires, cables or flex circuits. This connector design works effectively with a variety of printed circuit boards. This method of interconnect uses small, thin substrate printed circuit boards (specially designed for surface mount and manual soldering) to join circuit boards. The connectors are printed in sheets and strips and then separated into individual units. The resulting connectors can be easily handled and placed like conventional surface mount parts or, alternately, manually soldered. The connector offers several benefits, not only for ease of assembly, but also for the structure, appearance and reliability of the connection. Further, because the connector can be fabricated using conventional printed circuit board methods, the interconnect geometry can be easily adapted for any angle, split, and for a wide variety of pad sizes and spacing. This connector can be implemented to span short distances between boards or to join boards placed end to end. This connector is highly effective in joining printed circuit strips, as might be used for SSL lighting applications.

Embodiments of the present invention provide for a thin board substrate, which makes the connector flexible enough to conform to normal variations of board thickness, solder height and mechanical mounting height differences. The thin board substrate allows heat and solder to easily flow through the connector from top to bottom. An electrical insulating layer within the thin board is both thin enough to enable a high degree of thermal conductivity and is able to maintain high levels of breakdown isolation. The material chosen for the electrically insulating layer enhances thermal conductivity.

The thin board substrate adds flexibility to the connection, reducing stress at the solder joint associated with the use of rigid pins and other types of connectors. This assists in preventing tearing of the printed circuit board pads on the board when bending stresses are introduced. The thin board substrate materials and thicknesses assist in handling solder melt temperatures without delamination or damage. Copper pads on the bottom side of the connector are designed to match the pads of the boards to be connected; in spacing, area and thermal characteristics.

Copper pads on a top side can receive heat (such as from a soldering iron) and provide a path for conduction through the electrically insulating substrate and/or a plated through hole to the pads on the bottom. The copper conductors are used to connect the pads to be mated to the printed circuit boards. The copper conductors can be thick to accommodate high currents. Copper conductors can be run on top or under the connector insulating substrate, depending on requirements for isolation, current carrying capacity and protection.

Embodiments of the present invention provide for copper foils designed to maintain gap distances between connections for electrical isolation. Connections and conductors are protected from damage or shorting by being covered by the connector body. Connections and conductors can be further protected from moisture by the simple addition of an under fill layer of potting material, an encapsulent or an overcoat of potting material or encapsulant.

Plated holes located at the pad positions, through the connector board allow solder and heat to flow down into the connection both to facilitate solder connections and to enable rapid connection. The plated holes located at the pad positions take up excess solder when solder paste is used to make connections or when solder is applied manually. The plated holes located at the pad positions can be used to store solder paste for later reflow.

Embodiments of the present invention provide for sealing of solder paste in the holes at the pad positions so the paste remains fresh for later use. The sealing may include a thin solder layer, a thin flux layer or a thin plastic or metallic peel off material.

Angled or other geometric patterns in the pad and copper conductors support connections for offset or angled printed circuit boards. Multiple pad sets and associated conductor connections allow splitting of conduction paths.

A masking coating over the top and the bottom of the connector board (open at the pads), reduces the opportunity for solder shorts and improve the appearance of the connector. The masking material can be chosen to match the color and characteristics of the boards being jointed so to minimize the visibility of the connector.

The connectors can be easily formed for vertical step offsets. Connectors onto which other circuits can be used, including pads and geometries for wire or other conventional types of connectors, as well as terminations and active circuitry. The connectors can be stackable. Connectors with substrate can extend well beyond pad areas providing mechanical support. Connectors with additional pads can provide additional strain relief.

The pad geometries may match existing pinned connectors to allow an option to alternate use of pinned connectors or thin board connectors. Thin board connectors may be fabricated as strips or matrixes with multiple connectors. The thin board can be designed to be cut with scissors or a simple shear. Printed lines at the top of the strip or matrix can show expected cut lines; providing guidance. Copper pads, holes and conductors can be a sufficient space from the cutting location to assure only electrically insulating substrate will be cut. The thin board connectors can be overlapped for interconnection thus increasing the number of pads and adding to the joint strength.

Embodiments of the present invention provide for intimate contact between metal pads with minimal fill layer of solder to increase joint strength. Larger pads can be used to increase the strength, both because of the larger solder contact area, but also because of the larger areas of contact and adhesion between pad and insulating substrate. Larger areas of conductor surrounding exposed, soldered pad apertures increase the strength both by offering more area for adhesion between conductors and the insulating substrate, but also because they add to the conductor structure. The spacing of the pads for maximum array width and height increases the joint strength against shear and rotational forces and torques. A space between pad and edges of the board can be maintained to increase strength by decreasing leverage and converting stresses into surface pressures away from the joint.

Embodiments of the present invention disclose increasing the number of holes leading from the top surface to the pad, which increases the strength by adding more areas of solder fill. The increased number of holes also increases the probability of having a better percentage of solder fill. The choice of solder type and composition can have an impact on joint strength. Lead baring solders have lower tensile strength then their lead free counterparts. Higher tensile strength increases the fracture strength of the connection.

Embodiments of the present invention provide for the application of thermal tape or adhesive across the bottom side of the joint to increase joint strength. The application of potting material or other adhesives or coatings of the structure adds additional strength to the joint. In the areas of board overlap, excluding the conductive pad locations, adhesive can be added to increase joint strength.

With reference to FIG. 1, a top view of two circuit boards connected with a connector in an embodiment of the present invention is shown. Circuit boards 5 and 6 and shown joined with connector 2 to create LED circuit 100. While connector board 2 is shown coupling the top surfaces of circuit boards 5 and 6 it is fully contemplated connector board 2 could be coupled between circuit boards 5 and 6 in most any fashion including on the bottom surface of circuit boards 5 and 6 and overlapping between a top surface and a bottom surface. Circuit boards 5 and 6 are shown with component pads 4 for receiving LEDs or other components. While the present invention is directed towards flexible lighting circuit boards and more directly towards flexible LED circuit boards, it is fully contemplated the present invention could extend to most any type of circuit board. Circuit boards 5 and 6 are shown connected by connector 2. Connector 2 has plated through holes 1 through conductive metal pads 27. Plated through holes 1 allow solder to flow through to connect circuit boards 5 and 6 as will be discussed in more detail below.

Figure 2:
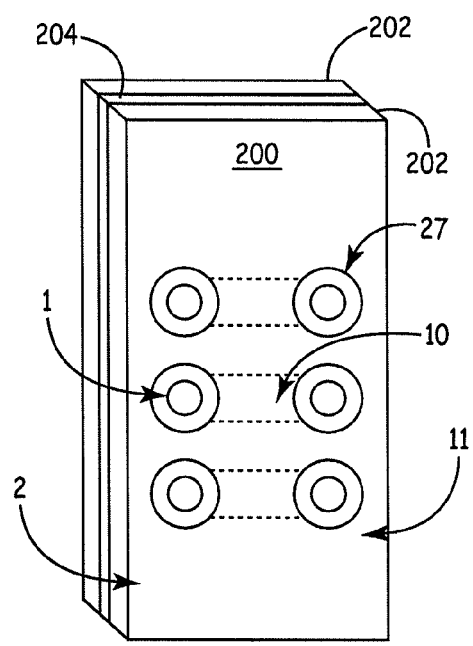
FIG. 2 shows a top profile view of a connector board in an embodiment of the present invention.

With reference to FIG. 2, a top profile of a connector board in an embodiment of the present invention is shown. Connector 2 consists of a thin circuit board 200 comprised of two electrically conductive layers 202 with a thin electrical isolating material 204 sandwiched in between. The inventors chose the electrically conductive layers to be 2 oz. copper. The inventors also chose the inner insulating layer to be 0.012 inch thick fiberglass composite material. Circuit paths 10 of various designs can be etched into the top and bottom conductive layers to produce the circuit conductive paths. Plated through holes 1 can be added at metal pads 27 and plated through with conductive metal to form a connection between top and bottom. Additional thin layers of non-conductive solder repelling material 11 (solder masks) can be added to the top and bottom of the board to restrict the movement of solder and protect the circuit paths from the pads.

Figure 3:
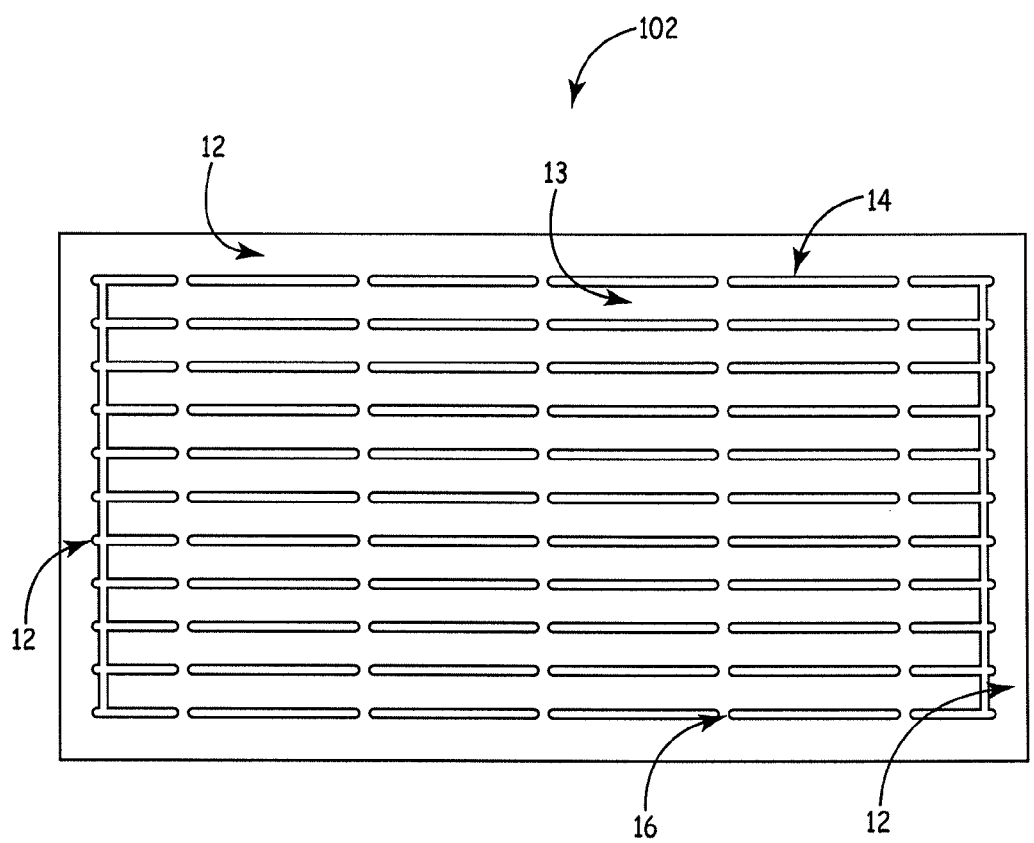
FIG. 3 shows a top profile view of an outline of routed panel ready for component assembly and cutting in an embodiment of the present invention.

With reference to FIG. 3, a top profile view of an outline of routed panel ready for component assembly and cutting in an embodiment of the present invention is shown. Panels 102 of thin, flexible printed circuit boards can be fabricated and routed so there is some amount of material 12 remaining to keep multiple parallel boards 13 in a parallel array. The material 12 outside of the circuit board array further stiffens panel 102 and may contain alignment marks or tooling holes for mechanical handling and alignment. Tabs 16 in a repeating pattern work well to hold circuit boards 13 together. Routed slits 14 between tabs 16 can be used to maintain mechanical alignment during assembly.

Panels 102 are of a design which allow them to be cut with a conventional shear or scissors at any of several locations enabling later trimming to length or separation. It is fully contemplated panels 102 could be laser cut as well to obtain circuit boards 5 and 6. Circuit boards 5 and 6 can be part of panels 102 as indicated by circuit board location 13. Electrical components, including LED emitters and optionally thin board connectors can be assembled onto panels 102 by conventional methods of electronic solder assembly. Optionally, the connector pad geometry may be incorporated into the board design so an additional connector board is not required.

Figure 4:
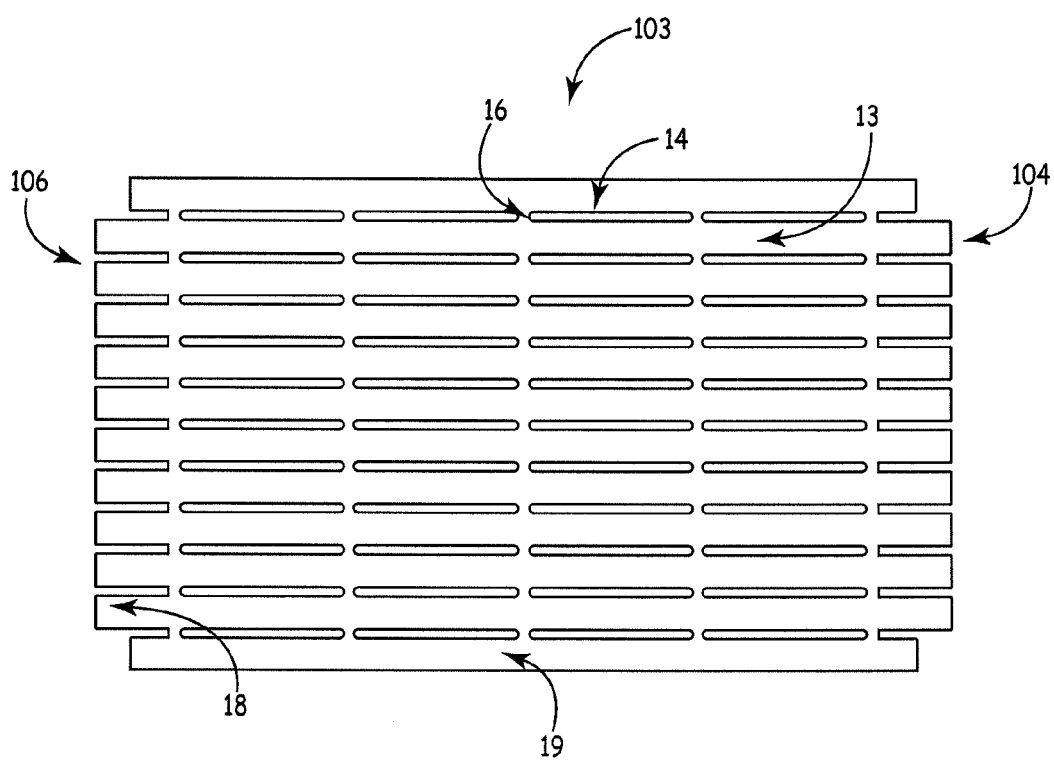
FIG. 4 shows a top profile view of a panel outline with ends sheared off to expose boards in an embodiment of the present invention.

With reference to FIG. 4, a top profile view of a panel outline with ends sheared off to expose boards in an embodiment of the present invention is shown. As shown, sheared panel 103 frees up one or both ends 106 and 104 of each printed circuit board 13. This may have been done during the original panel fabrication. A portion of the frame 19 may be retained to add stiffness to the assembly and may contain alignment marks and tooling holes used to maintain mechanical alignment during assembly.

Figure 5:
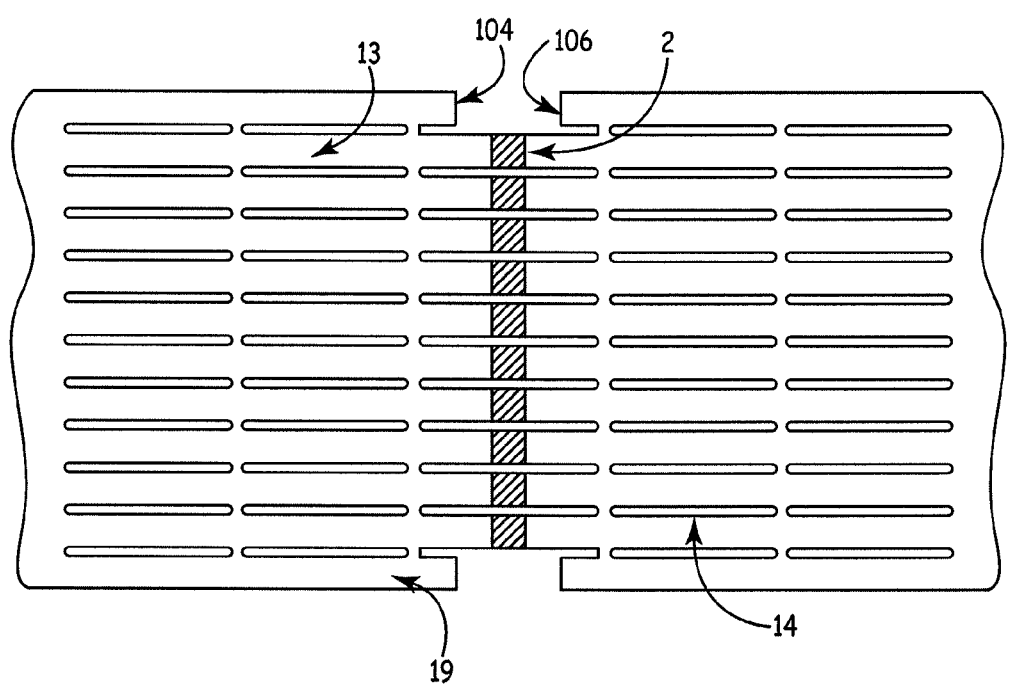
FIG. 5 shows a top profile view of panels joined by connectors in an embodiment of the present invention.

With reference to FIG. 5, a top profile view of panels joined by connectors in an embodiment of the present invention is shown. A free end 104 of one panel can be butted against a free end 106 of the other so several circuit boards can be joined by soldering or welding, thus forming a longer assembly with the same characteristic of parallel strips. Depending on desired length, the process can be repeated by adding additional panels 103 to an elongated panel made of additional panels 103. After the desired length is attained, the strips can be separated by shearing any remaining connecting material. As the long strips are joined, a strip of lined thermal adhesive tape 28 (FIG. 8) can be affixed to the bottom of the strips in a continuous action. The exposed liner will be later removed during application to a fixture or permanent mount. The addition of thermal adhesive tape 28 may occur just before or after panels 103 are joined together. The resulting elongated strips may then be wound onto large diameter reels so they can be easily protected, transported, and stored; ready for final assembly onto heat sinks or light fixtures. As an alternative, the strips may be short enough to be packaged and shipped in flat form.

Figure 6:
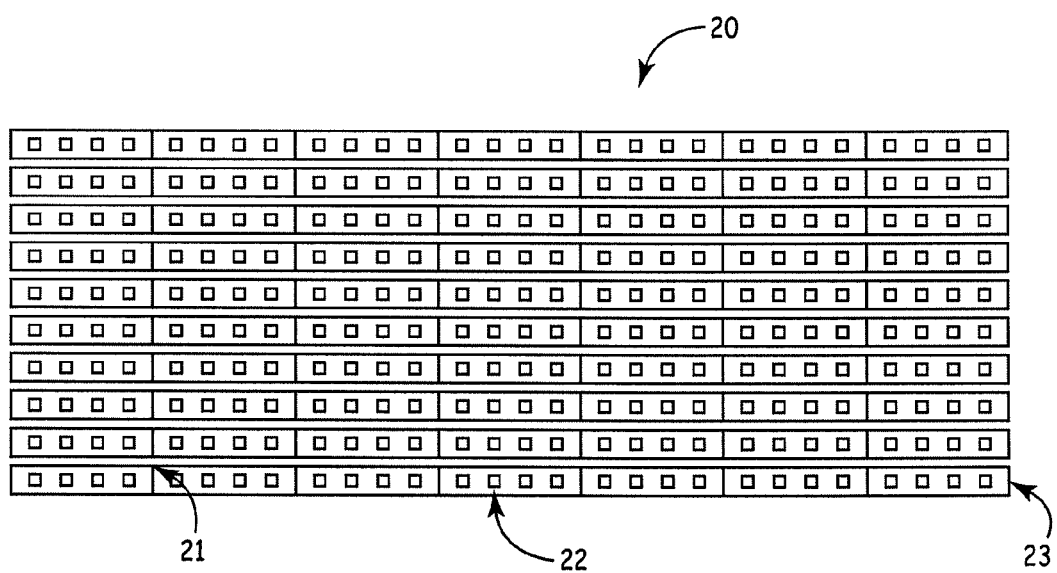
FIG. 6 shows a top profile view of circuit strips after separation in an embodiment of the present invention.

With reference to FIG. 6, a top profile view of circuit strips after separation in an embodiment of the present invention is shown. As shown, circuit strips 20 can be separated from panels 103. Connection point 21 connecting two or more circuit strips can be a connector 2 as discussed above or an overlap joint discussed in more detail below. LEDs 22 or other components can be adhered or placed on circuit strips 20 and circuit strips 20 can terminate at ends 23.

Figure 7:
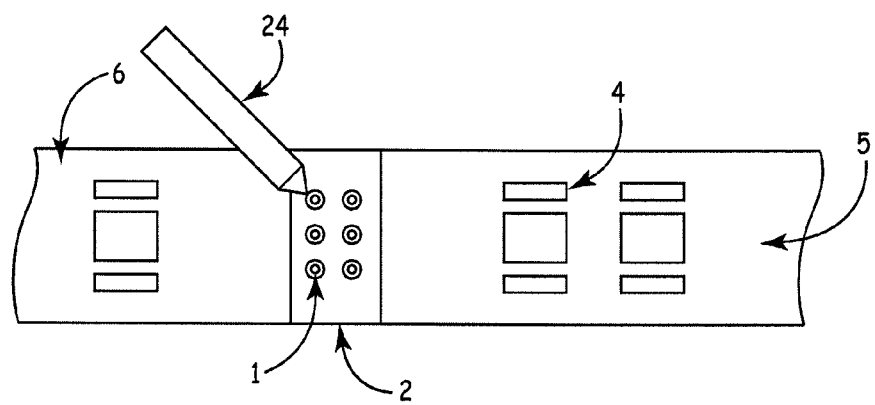
FIG. 7 shows a top profile view of soldering of connector joint in an embodiment of the present invention.

With reference to FIG. 7, a top profile view of soldering of a connector joint in an embodiment of the present invention is shown. Thin circuit boards 5 and 6 makes connector 2 flexible enough to conform to normal variations of board thickness, solder height and mechanical mounting height differences. In an embodiment, connector board 2 is shown to bend with a radius 42 of down to 1 inch (see FIG. 14). The thin connector board 2 allows heat and solder to easily flow through connector 2 from top to bottom as heat is applied. Solder may be introduced into through hole 1 at the top of connector board 2. Alternatively solder may be in paste or hard form deposited on receiving printed circuit board 5 or 6, in which case solder will flow from bottom to top.

Electrically insulating layer 204 within the thin board is thin enough to both enable a high degree of thermal conductivity and is able to maintain high levels of electrical breakdown isolation. Electrical isolation between circuits is helpful to the general function of the connector; however, the amount of isolation may be changed in design to conform to the application requirements.

The material chosen for the electrical insulating layer enhances thermal conductivity. In one embodiment the electrically insulating layer was chosen as a high temperature variant of FR4 fiberglass with a glass transition temperature of 170° C., although other materials can be used. A higher than normal temperature rating of the material is intentionally used to gain more thermal margin allowing for the very rapid heating (and probable overheating during manual assembly) of the thin boards due to their low thermal mass. Even higher temperature materials would be helpful in the case higher melting temperature solders are to be used. It is helpful to use an insulating layer both durable at high temperatures and as highly thermally conductive as possible for this construction. Thermal conductivity is helpful for the cases of solder iron or point heat source assembly because it aides in rapid transfer of heat from the top side of the connector to the joints below.

Thin connector 2 adds flexibility to connection 21, reducing stress at the solder joint associated with the use of rigid pins and other types of connectors. This is helpful to prevent tearing of the printed circuit board pads on the board when bending stresses are introduced. In one implementation, connectors 2 can be used to form a continuous strip of boards which is then rolled into reel form. The bend radius 42 of this implementation can be 6 inches or greater.

Thin board substrate materials and thicknesses are chosen to handle solder melt temperatures without delamination or damage. Alternate choices for board insulating material are possible such as Thermagon™ in cases where higher temperature resilience and higher thermal conductivity are needed. An embodiment was developed for use with lower temperature solders (leaded). Copper pads are on the bottom side of the connector or upper board 31 are designed to match the pads of the receiving board 33—in spacing, in area, in thermal characteristics.

Figure 8:
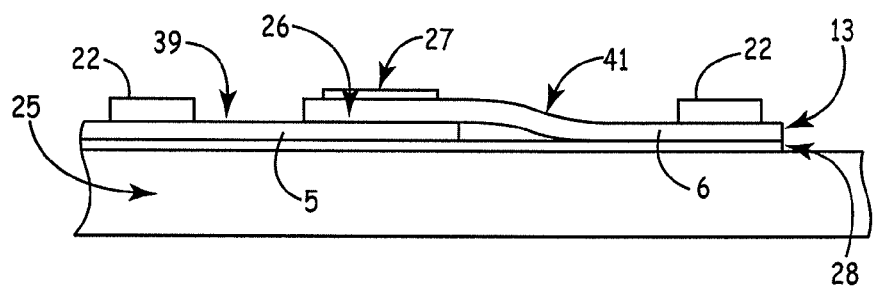
FIG. 8 shows a top profile view of an overlapping joint between boards in an alternate embodiment of the present invention.
Figure 11A:
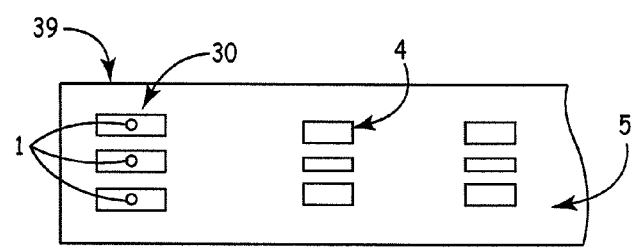
FIG. 11A shows a top view of top board pads and holes in an embodiment of the present invention.
Figure 11B:
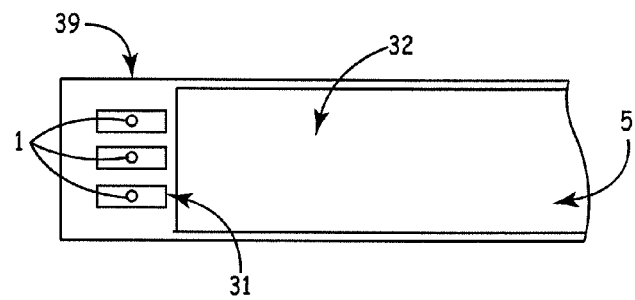
FIG. 11B shows a bottom view of top board pads and holes in an embodiment of the present invention.
Figure 12:
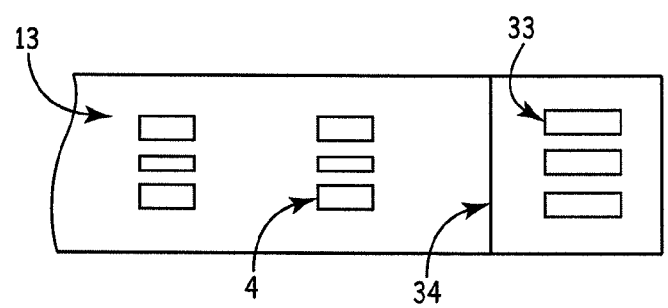
FIG. 12 shows a top view of bottom board receiving pad geometry in an embodiment of the present invention.
Figure 13A:
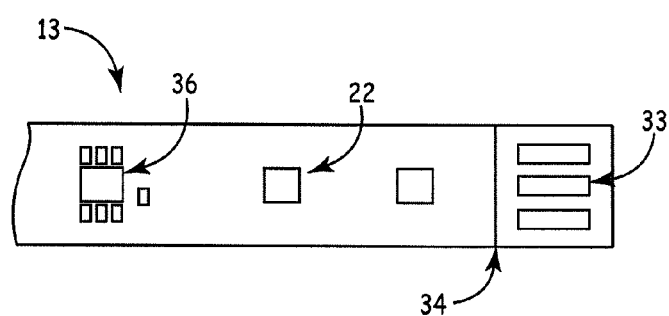
FIG. 13A shows a top view of an assembled board prior to joining in an embodiment of the present invention.
Figure 13B:
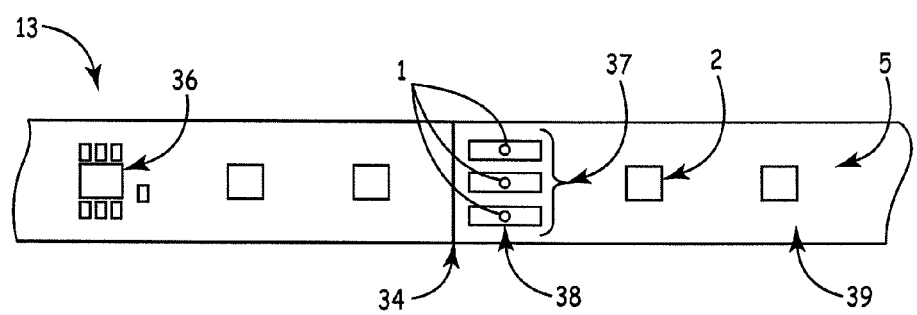
FIG. 13B shows a top view of joined boards in an embodiment of the present invention.

With reference to FIG. 8, a top profile view of an overlapping joint between boards in an alternate embodiment of the present invention is shown. In the embodiment of FIG. 8 no connector board 2 is necessary to connect circuit boards 5 and 6. Copper pads 27 can be on the top side to receive heat (such as from a soldering iron 24) and provide a path for conduction through the electrically insulating substrate and/or a plated through hole 1 to pads 33 on the bottom. The size of pads 30, 31 and 33 (FIGS. 11A, 11B and 12) factor into both the quality of the connection and the mechanical stress the connection can sustain. Also, by embedding or closely connecting through holes 1 to pads 31 38, the mechanical performance is improved. The metal plating and solder fill through hole 1 links top side pads 27 to bottom side 33 making the bottom side very difficult to pull off (delaminate) from the insulating layer. In the embodiment, holes of 0.036 inch diameter are used to promote heat transfer, conduct solder and add enough structure to strengthen the joint. Lapped joints add strength by adding additional contact area, by reducing leverage, and by changing certain forces from shearing and tensile to compressive.

The interconnect aspect of FIG. 8 allows for the coupling of circuit boards without a connector board or any other device between them. Thus circuit boards 5 and 6 can be created with ends 104 and 106 which have pads 30, 31 and 33 with though holes 1 to allow coupling of the circuit boards.

Copper conductors can be used for connecting pads 27 to be mated circuit path 10. Circuit path 10 can be printed in almost any pattern commonly used in circuit boards and can be patterned to receive electronic components 4 such as LEDs 22 or integrated circuits 36. The copper conductors can be very thick and wide to accommodate high currents. In an embodiment 2 oz. copper was used with a conductor width of 0.040 inch to enable a low voltage drop across the connector when carrying up to 5 amps of current.

Copper foils are designed to maintain gap distances between connections for electrical isolation. In an embodiment, voltage isolations of up to 500 V were maintained by maintaining a distance of 0.025 inches between copper foils. By increasing the spacing, substantially higher isolations can be achieved. Copper conductors can be run on top of or under the connector insulating substrate, depending on requirements for isolation, current carrying capacity and protection. Connections and conductors are protected from damage or shorting by being covered by the connector body or overlapping joint 26.

Connections and conductors can be further protected from moisture by the simple addition of an under fill layer of potting material or an encapsulent or an overcoat of potting material 29 or encapsulent. Potting compounds or conformal coatings are commonly used in the industry to provide this type of protection. This type of connector is particularly suitable for these coatings because it is essentially flat with no recesses or areas which must be protected from contact with the coatings.

Plated holes 1 located at pad positions 27, 30 and 31 through connector board 2 allow solder and heat to flow down into the connection both to facilitate solder connection and to enable rapid connection. The rate of heat transfer being increased by this structure has the additional benefit of speeding up solder melting and cooling both during manual soldering and reflow processing. This saves time and results in better, more repeatable and stronger joints. It is known in the industry faster cooling times result in stronger, more uniform solder joints.

A number of experiments were conducted to determine solder wetting and flow paths for various pad geometries using the thin connectors in surface mount applications. After it is melted, solder tends to wet to the metal pads 30 and exposed conductors of printed circuit boards 5 and 6. It moves by capillary action to actively fill small gaps and spaces between pads 31 and 33, particularly pads in flat surface-to-surface contact. The high degree of adhesion and capillary action exhibited by solder, combined with the mechanical weight of the thin board connector caused pads of connector 2 and board 5 and 6 to pull together pushing remaining solder outward between pads 31 and 33. If solder was applied in exactly the correct amount, the solder would simply fill the joints. But even in small excess, the solder would press outside of the pad areas promoting shorts and lower electrical isolation. Holes, recesses or pockets between the pads were tried and did take up the excess solder. However, the approach was to design in plated holes 1 within the area of the pads taking up the solder through capillary action, effectively pulling excesses into rather than out of the joint. In the embodiment, the holes were approximately 50% of the diameter of the pad, giving ample room for significant variances in solder application.

As a further improvement, plated holes 1 can be used as receptacles for solder paste so connectors 2 could be ready for joining by heat alone. Once aligned to printed circuit boards 5 and 6, connector 2 (or selectively its pads) could be heated to cause the solder to begin melting for example using a soldering iron 24. By capillary action and wetting, the solder quickly flows down into the space between connector 2 and board pads completing the joint. Flux and activating resins, which are commonly incorporated into solder paste, are needed for high quality solder joints. In one embodiment, the same plated holes 1 absorb excess solder used to store solder prior to thermal joining. Further, it is recognized the holes can be filled with either solder paste or separated layers of hard solder and flux resin. In one experiment, solder wire with a core of flux resin was press fit in holes 1 and sheared to match the connector bottom surface 26. This was another effective way of putting solder and flux into plated holes 1. Sealing of solder paste in holes 1 at pad positions 27 and 26 is helpful so paste remains fresh for later use. Sealing may include a thin solder layer, a thin flux layer or a thin plastic or metallic peel off material.

As part of the printed circuit board fabrication process, mask coatings can be placed over top 11 and the bottom of the connector board (open at the pads), reducing the opportunity for solder shorts and improving the appearance of the connector or overlapping joint. In the embodiments, the mask coating was chosen to match the color and characteristics of the boards being jointed so to minimize the visibility of connector 2. Connector 2 can be implemented without mask coatings on the top surface as this is less critical to the solder flow protection function.

Connectors 2 can be easily mechanically formed for vertical step offsets 41. In experiments run on these connectors 2, bends up to a right angle could be performed with the conductors (or any foils crossing the bend) on the inside radius of the bend.

Connector boards 2 can incorporate other circuits, including pads and geometries for wire or other conventional types of connectors, as well as being able to incorporate terminations and active circuitry. Connector board 2 is particularly well suited because of its highly thermally conductive structure for power and heat creating circuits. In one implementation, the circuitry for high current driver (One Semiconductor #NUD4001 operating at 24 VDC) along with an LED string was added to the top side of the board. Both the top FIG. 11a and bottom side FIG. 11b of the board were designed with large metal (copper) pads 30 and 31 which could translate heat through the thin insulating material by effectively creating a large area for heat transfer from the top copper layer through the less thermally conductive insulating layer and to the bottom copper layer. Further, a thermally conductive adhesive tape 28 (e.g., 3M product #8810) can be applied to the back side. The assembly can then be adhered to a heat sink 25. The resulting structure maintained excellent heat transfer to the heat sink, which is particularly important in high brightness LED applications.

Because this connector can be easily fabricated in many shapes, it can be used for connection between boards directly abutted (FIG. 5) or some distance apart. Also, since the conductors can be on either top or bottom, or embedded in a center layer, electrical isolation from neighboring structures can be high and possible shorting points can be readily avoided. Connectors 2 are stackable and can be soldered one to another.

In cases where additional mechanical support is needed, the connector can extend well beyond the pad providing maximum overlap. It may be necessary to shape the connector or have it fabricated with clearance holes if components on the underlying board may interfere. Connector 2 can be fabricated with additional pads and holes (not connected to the circuits) to give additional strain relief. Pad geometries may match existing pinned connectors to allow the option to alternate use of a pinned connector or thin board connector. Thin board connectors may be used to join circuit boards into strips 20 or matrixes with multiple connectors or connections 21 in each assembled length (See FIG. 6).

Figure 9:
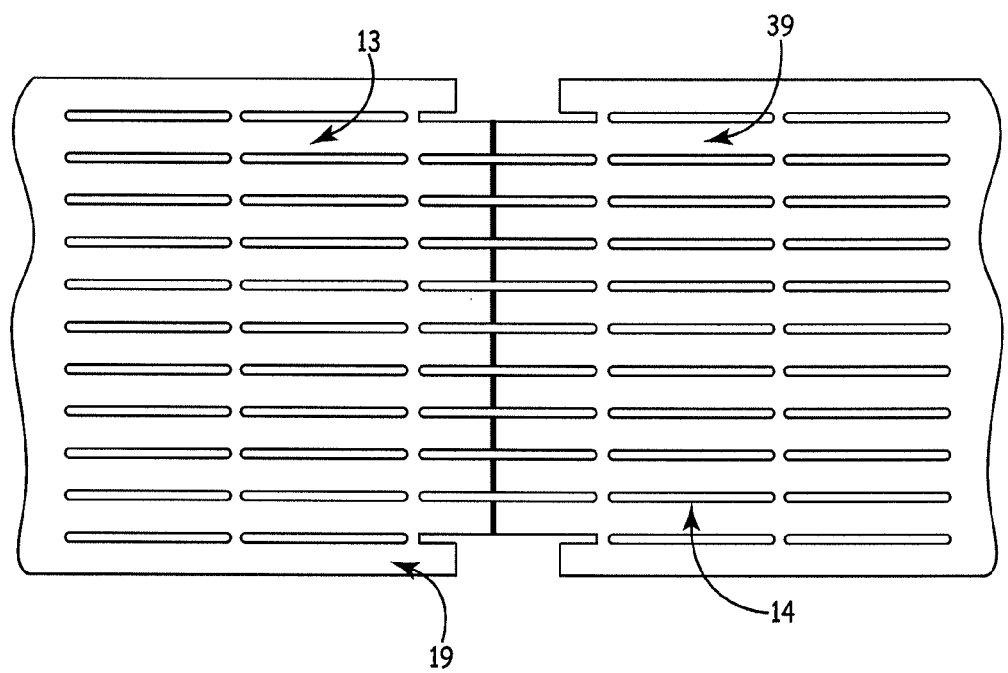
FIG. 9 shows a top profile view of panels joined by overlapping joints in an embodiment of the present invention.

Thin board connectors can be overlapped for interconnection (See FIG. 8). This is very useful if the connector board contains active circuitry and it is beneficial to connect multiple boards, such as in the fabrication of a continuous strip of boards (See FIG. 6). The thin board connectors are highly advantageous to the assembly of strips consisting of multiple circuit boards (See FIG. 9). In a practical application, they are used to make long circuit board strips of solid state lighting circuits (e.g., high power LED emitters used as the individual light sources).

Thin circuit board 13 consisting of a thin, low thermal mass substrate base material comprised of two electrically conductive layers with a thin, electrically isolating material sandwiched in between. Electrically conductive layers used for proof of concept testing were of 2 oz copper. The thin, semi-flexible circuit boards can be designed with regions of conductors and pads allowing them to function as connectors, enabling the mating of one board to another. The thin board connector consists of a thin, low thermal mass substrate base material comprised of two electrically conductive layers with a thin, electrically isolating material sandwiched in between. Electrically conductive layers used for proof of concept testing were of 2 oz copper. The inner insulating layer was chosen to be 0.012 inch thick fiberglass composite material. Both of these are common to circuit board fabrication, however generally used for inner layers of a multilayer circuit board, not for circuit board in completion. Circuit patterns of various designs were etched into the top and bottom conductive layers to produce the circuit conductive paths. Holes are added at the pad locations and plated through with conductive metal to form a connection between top and bottom. Additional thin layers of non-conductive, solder repelling material (solder masks) were added to the top and bottom of the board to restrict the movement of solder and protect the circuit paths away from the pads.

Angled or other geometric patterns in the pad and copper conductors support connections for offset or angled printed circuit boards. Multiple pad sets and associated conductor connections allow splitting of conduction paths.

Figure 14:
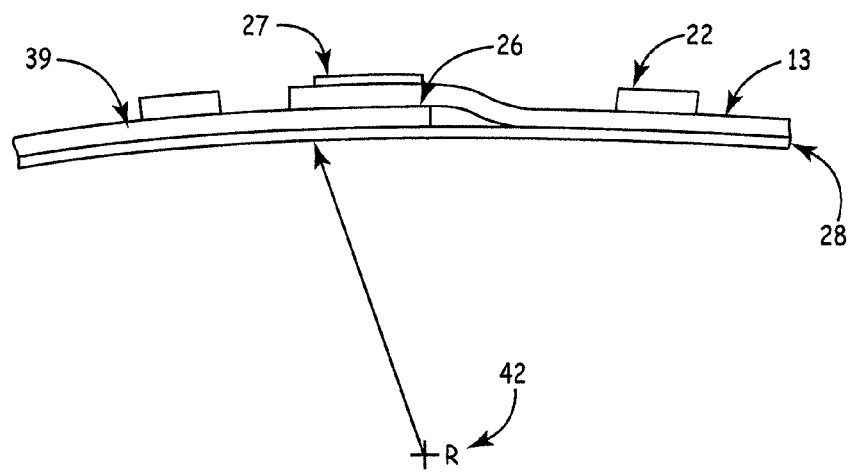
FIG. 14 shows a side view of a joint assembly of a flexible strip with curvature in an embodiment of the present invention.

The thin circuit board as described is flexible enough to conform to normal variations of board thickness, solder height, and mechanical mounting height differences (See FIG. 14). Goals for high reliability connections include robustness, both in mechanical strength and in integrity of the electrical connection. Several designs and methods were explored and found to improve both mechanical strength, and in many cases to improve the electrical connection integrity. By increasing the number of pads 30, 31 and 33 used in the connector, mechanical strength was benefited. Simple multiplication of the number of contacts added to the strength by spreading stress across the added contacts. Redundant parallel contacts reduce electrical resistance and add to the general integrity of electrical connection.

Intimate contact between metal pads with minimal fill layer of solder increases joint 26 strength. A thick layer of solder decreases strength but adds some flexibility to the joint. Solder has generally a much lower tensile and shear strength than the conductors it joins. Further, it tends to have a course crystalline structure and is susceptible to fracturing. A thin layer of solder between copper pads (used the pad material) is much less susceptible to fracturing both because of smaller (or incomplete) crystal formation, and because stresses are transferred locally to the stronger copper, instead of into the solder itself.

Increasing the size of the pads 31 and 33 increases the strength both because of the larger solder contact area, but also because of the larger areas of contact and adhesion between pad and insulating substrate. In multiple trials, larger pads consistently increased the strength as measured in pull tests and in bending tests. Larger areas of conductor surrounding exposed, soldered pad apertures increase the strength both by offering more area for adhesion between the conductor and the insulating substrate, but also because they add to the conductor structure.

Increasing the distance across a set of pads 37 or span increases the joint strength against shear and rotational forces and torques. Shear and rotational forces (torques) are common highest during handling of the joined boards. Of particular use, the assembly of multiple boards into long strips presents the opportunity to put very high torques on the joint connection because of the length and lever arm advantage. Preventing damage due to rotational forces is helpful to having reliable joints when the strips are packaged and used in their multiple forms including strips and continuous reeled lengths.

By increasing the distance of the pads from the overlapping edges of the board, the inventors have found a decreased leverage on the individual connections by converting stresses into surface pressures away from the joint. By increasing the number of holes 1 leading from top surface to the pads below, an increase in the strength is discovered by adding more copper cylindrical connections and rivet like columns of solder fill linking top to bottom. Increased number of holes also increases the probability of having a better percentage of solder fill between the boards. The choice of solder type and composition has a direct impact on joint strength. Lead baring solders have lower tensile strength then their lead free counterparts. Higher tensile strength increases the fracture strength of the connection.

Figure 10:
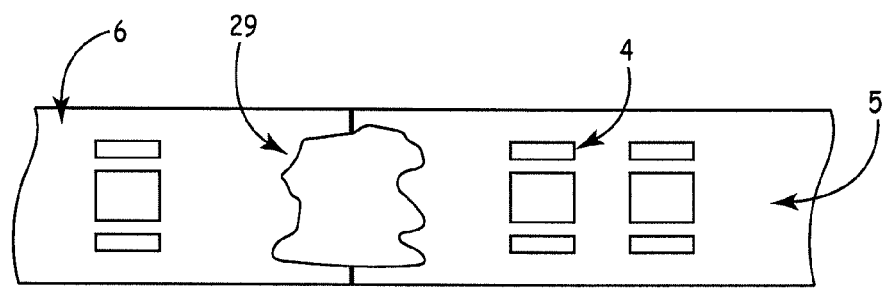
FIG. 10 shows a top profile view of potting material used to strengthen and protect connection joints in an embodiment of the present invention.

The application of tape or adhesive 28, across the bottom side of joint 26, further increases joint strength for handling. Viscous tapes act as a spring and dampener to certain stresses, moving forces away from the joint. The application of potting material 29 or other adhesives or coatings of structure adds additional strength to joint 26 as well as protection from mechanical damage and/or moisture (See FIG. 10).

In the areas of board overlap, excluding the conductive pad locations, adhesive applied between top and bottom board can be added to increase joint strength. Thin board connectors 2 or thin circuit boards 13 and 39 with overlapping joints 26 can be used to construct elongated strips of multiple circuit boards 20. Mass parallel construction of long circuit board strips carrying high intensity LEDs for SSL applications has been demonstrated using these connection types.

Figure 15:
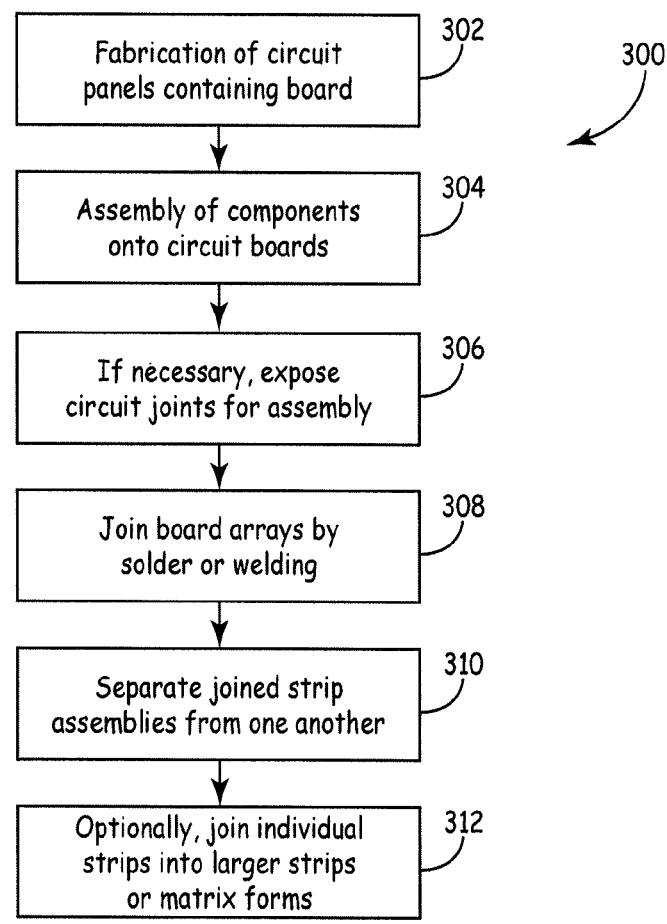
FIG. 15 shows a process flow diagram for construction of multi-board assemblies in strip or matrix form in an embodiment of the present invention.

With reference to FIG. 15, a process flow diagram for construction of multi-board assemblies in strip or matrix form in an embodiment of the present invention is shown. Process 300 starts at state 302 where circuit panels 102 are fabricated as discussed in detail above. At state 304 components, such as LEDs are coupled to circuit boards 5 and 6, which are developed from panel 102. If necessary, circuit joints 18 are exposed for assembly at state 306. At state 308 board arrays are joined by solder or welding. At state 310 the joined strip assemblies are separated from each other. At state 312 individual strips are joined into larger strips or matrix forms.

Thus, embodiments of the PRINTED CIRCUIT BOARD FLEXIBLE INTERCONNECT DESIGN are disclosed. One skilled in the art will appreciate the present teachings can be practiced with embodiments other than those disclosed. The disclosed embodiments are presented for purposes of illustration and not limitation, and the present teachings are limited only by the claims follow.

The invention claimed is:

1. A circuit board interconnect, comprising:
    a first circuit board having a first conductive layer located on top of an electrical isolating material and a second separate conductive layer located below the electrical isolating material, a metal pad and a plated through hole within the metal pad on the first circuit board, the through hole providing a passage for solder to connect the first circuit board to a second circuit board; and
    the second circuit board having a first conductive layer located on top of an electrical isolating material and a second separate conductive layer located below the electrical isolating material, a metal pad able to couple to the first circuit board in an overlapping fashion when solder is passed through the plated through hole such that the bottom surface of the first circuit board is coupled to the top surface of the second circuit board.

2. The apparatus of claim 1, wherein the circuit boards are flexible and can have a radius.

3. The apparatus of claim 1, further comprising a non-conductive solder repelling material on a surface of one circuit board.

4. The apparatus of claim 1, wherein the first and second circuit boards are premade to be interconnectable.

5. The apparatus of claim 1, wherein the electrical isolating material of the first circuit board comprises fiberglass.

6. The apparatus of claim 5, wherein the conductive layer of the first circuit comprises copper.

7. The apparatus of claim 1, further comprising electronic components coupled to the first conductive layer of the first circuit board, the electronic components comprising a light emitting diode.

8. The apparatus of claim 1, wherein the top surface of the first circuit board is in electrical communication with the top surface of the second circuit board.

9. A method of coupling circuit boards together, comprising the steps of:
    placing a first circuit board on top of a second circuit board, the first circuit board comprising a first conductive layer located on top of an electrical isolating material and a second separate conductive layer located below the electrical isolating material, a metal pad and a plated through hole within the metal pad on the first circuit board, the through hole providing a passage for solder to connect the first circuit board to the second circuit board, the second circuit board comprising a first conductive layer located on top of an electrical isolating material;
    heating solder to flow through the plated through hole; and
    allowing solder to flow and couple the first circuit board and the second circuit board.

10. The method of claim 9, further comprising the step of placing light emitting diodes onto the first circuit board.

11. The method of claim 9, the first circuit board and the second circuit board forming part of a circuit panel.

12. The method of claim 11, further comprising exposing circuit joints for assembly.

13. The method of claim 11, further comprising the step of joining circuit panels into multi-panel arrays.

14. The method of claim 13, further comprising the step of separating the multi-panel arrays into a plurality of strips of coupled circuit boards.

15. The method of claim 14, further comprising joining strips of coupled circuit boards.

16. The method of claim 15, further comprising separating the joined strips of coupled circuit boards.

\* \* \* \* \*